United States Patent [19]

Kim

[11] Patent Number: 4,771,932

[45] Date of Patent: Sep. 20, 1988

[54] METHOD FOR SOLDERING AND DESOLDERING ELECTRONIC COMPONENTS

[76] Inventor: Henry Kim, 1640 Maple Dr., Unit 5, Chula Vista, Calif. 92011

[21] Appl. No.: 95,637

[22] Filed: Sep. 14, 1987

Related U.S. Application Data

[63] Continuation of Ser. No. 806,643, Dec. 9, 1985, abandoned.

[51] Int. Cl.$^4$ .............................................. B23K 31/02
[52] U.S. Cl. .................................. 228/180.1; 228/264
[58] Field of Search .................... 228/19, 51, 119, 264, 228/180.1, 20, 179

[56] References Cited

U.S. PATENT DOCUMENTS

| | | | |
|---|---|---|---|
| 3,529,760 | 9/1970 | Hickman et al. | 228/51 |
| 3,632,972 | 1/1972 | Halstead | 228/19 |
| 3,632,973 | 1/1972 | O'Keefe | 228/51 |
| 3,649,809 | 3/1972 | Halstead | 228/19 |
| 3,673,384 | 6/1972 | Burman et al. | 228/19 |
| 4,034,202 | 7/1977 | Vandermark | 228/19 |

Primary Examiner—M. Jordan
Attorney, Agent, or Firm—Ralph S. Branscomb

[57] ABSTRACT

A soldering iron which is developed specifically to address a wide variety of miniaturized integrated circuit soldered pin configurations has a handle with a heating block which mounts one of a set of wide, chisel-shaped blades that are engaged in a deep channel in the heating block and which taper gradually to a knife edge which is the operative edge of the soldering head. The wide, thin, extensively tapered and knife-edged blade usually addresses a row of integrated circuit pins or surface mounted leads to act brush-like to solder them substantially at the same time, or to heat them substantially simultaneously when desoldering the row to remove the component.

2 Claims, 2 Drawing Sheets

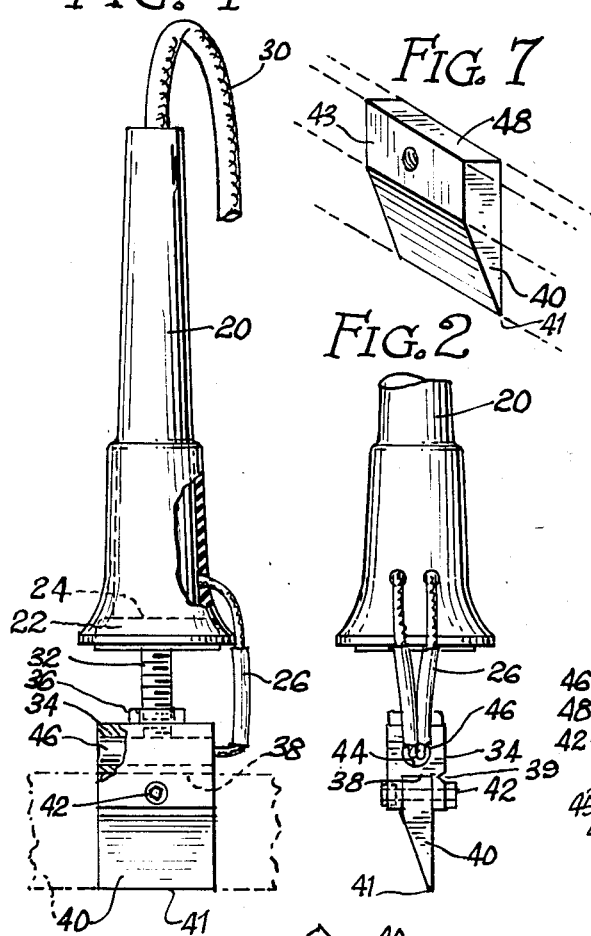

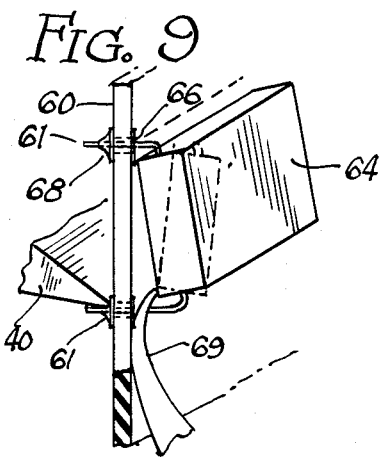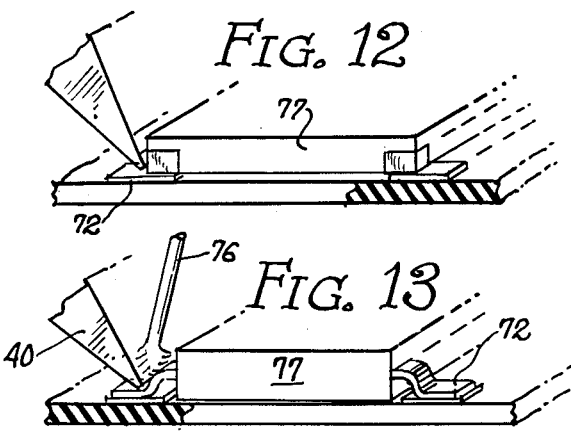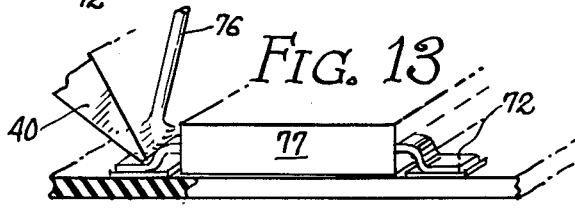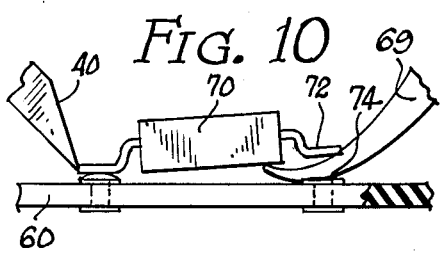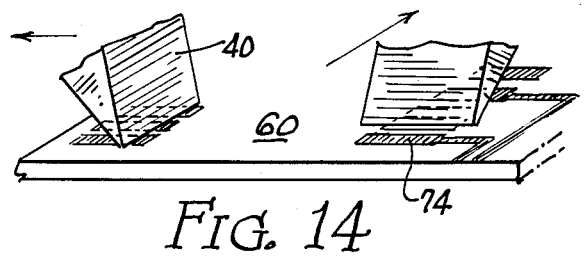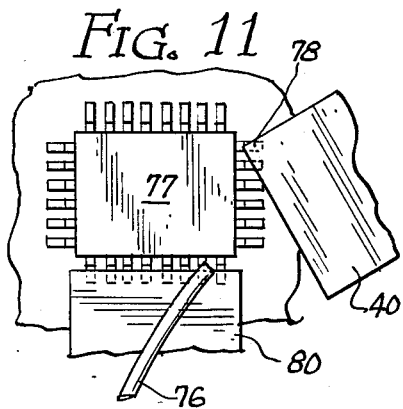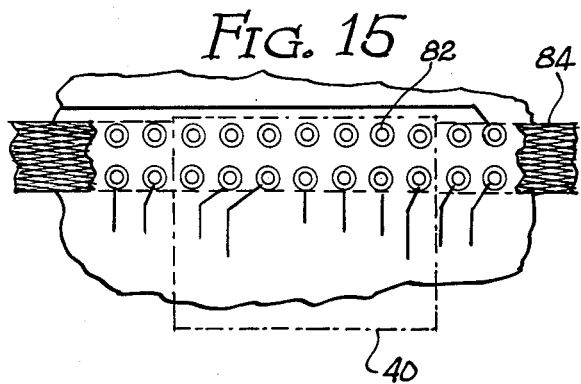

METHOD FOR SOLDERING AND DESOLDERING ELECTRONIC COMPONENTS

BACKGROUND OF THE INVENTION

This application is a continuation of application Ser. No. 06/806,643 filed 12/09/85, now abandoned entitled Broadhead Soldering Iron and Means for Using Same, also invented by Henry Kim.

The invention is in the field of soldering, and more particularly pertains to the soldering of individual miniaturized components to circuit boards, rather than to mass production utilizing automated techniques and solder baths. It is particularly useful in soldering the tiny, closely spaced leads of surface mounted devices, which represent the newest circuit board technology and are rapidly replacing the prior state-of-the-art micro-miniaturized components with pass-through leads.

The art of individual component soldering has progressed from the time when large, single components with a few long leads were typical, to modern times in which packaged components have tiny, closely-spaced leads numbering up to more than a hundred in a single row. Soldering irons have developed correspondingly smaller tips and finer soldering wire is used. Some specialized tips are available for use with specific components, generally for desoldering. But in general, the point tip iron is still used for soldering the wide variety of sizes and shapes of available components, addressing each contact and solder joint separately.

To hand-solder a typical Dual In-Line Package (DIP) having up to 60 conventional leads (that is, leads which pass through the PC board) will take an experienced operator a minute or two to mount using the current technique. A high density 100-pin Surface Mount Device (SMD), which has smaller leads which are about twice as closely spaced as the leads of a conventional component, will take four or five minutes.

Component removal is even more tedious and time-consuming. Because each solder joint must be heated individually, solder has to be sucked out of each through-hole pad in the board with a vacuum before a component with pass-through leads can be lifted from the board as a unit. If the first round of heating/vacuuming is not completely effective, the operator has to take the time to track down the holes that are still stuck to the leads and repeat the heating/vacuuming process.

SUMMARY OF THE INVENTION

The instant invention, was inspired by the need to solder and desolder the micro-miniaturized lead configuration of surface mounted devices, the latest technology in integrated circuits. The invention alleviates the above-described time-consuming tedium by providing a broadhead soldering iron that is capable of either soldering or desoldering an entire row of leads in a single stroke. The handle portion of the iron is basically conventional, but the head end removably mounts any one of a set of wide, chisel-shaped tips which vary in width to accomodate lead rows of differing lengths.

The first step in either soldering or desoldering a component is the selection of a chisel tip which is about as long as the rows of leads to be heated. The sharp edge of the chisel is applied to the leads in the row, and in a second or so the leads or solder joints at the leads will have reached the solder melting point. A DIP which would take two minutes to mount utilizing a point tip iron is soldered into place in 15 seconds with the chisel tip. The 100 lead high density SMD (surface mounted device) mentioned above can be mounted in a ninety seconds rather than four minutes. Thus the time savings in sizable PC board production operation can be enormous, while at the same time job tedium and eyestrain are reduced.

In addition to time savings, the blade produces a very even heat distribution to very closely spaced leads. This creates a solder flow that flows almost immediately to the leads, without bridging between leads. It is especially effective for SMD's. By pulling the blade away from the component and wiping the leads as it moves, it draws or "pulls" any solder between the contacts with it, almost automatically drawing the solder from those places where it shouldn't be to either the leads or to the iron.

BRIEF DESCRIPTION OF THE DRAWINGS

FIG. 1 is a top elevation view of the soldering iron with a portion cut away;

FIG. 2 is a side elevation view of the front, tip portion of the iron with a portion cut away;

FIG. 3 is a section taken through the front end of the iron orthogonally to the run of the soldering blade;

FIG. 4 is a section identical to FIG. 3 but with a modified blade mounted in the heating head;

FIG. 5 illustrates the soldering of a typical DIP;

FIG. 6 illustrates the removal of a standard connector using the modified blade of FIG. 4;

FIG. 7 is a perspective view of a typical blade illustrating in phantom the direction the blade extends for larger blades:

FIG. 8 illustrates, identically to FIG. 7, the modified blade with the reservoir edge of FIG. 4;

FIG. 9 illustrates the proceedure for walking a DIP off a board using a prying pick;

FIG. 10 is a side view illustrating the removal of an SMD;

FIG. 11 is a top plan view illustrating the mounting of an SMD;

FIG. 12 is an isometric view of a portion of an SMD illustrating the heating of the lead row with the blade;

FIG. 13 illustrates the application of solder after the step of FIG. 12;

FIG. 14 illustrates the tinning on the pads of a surface mount type PC board;

FIG. 15 illustrates the the removal of excess solder from the through hole pads of a conventional board using a solder wick; and, FIG. 16 illustrates a section through the tip of the modified blade showing the groove in the tip.

DETAILED DESCRIPTION OF THE PREFERRED EMBODIMENTS

As seen in FIG. 1, the soldering iron has a handle 20 with an insulating collar 22 and a metal insert 24 which mounts the support bolt 32. The power cord 30 passes through the handle, exits the handle, and the wires are sheathed in silicone insulating sleeves as shown at 26 for heat resistance as they approach the heating head 34. The support bolt threadedly engages a heating head 34 as is illustrated in FIGS. 1-4, and is tightened down against the heating head with lock nut 36.

The heating head is preferably composed of copper or copper alloy. It is block-shaped, and has a rectangular channel 38 defined in its forward surface to receive in tightly seated relation the chisel-shaped soldering blade 40 having a sharp operative edge 41. The soldering blade has a rectangular shank portion 43 which is retained in the seating channel by means of a retainer nut and bolt 42 passing through the tangs 45 and the blade.

A transverse bore 44 which passes all or partway through the heating head seats the cylindrical heating element 46 in snug, or even press-fitted relation. The heating element is similar to a conventional soldering iron element, which in a conventional soldering iron is longitudinally extended in axial allignment with the soldering tip rather than the laterally extended arrangement shown in FIGS. 1-4.

Heat transfer from the heating element to the blade is maximized by the above-described relationship. The tightly fitting heating element efficiently transfers its heat to the larger mass of the heating head, and the heating element is not only parallel to the soldering blade 40, but is very close to it, on the order of less than a quarter of an inch away. In contradistinction to a conventional soldering iron, the heating element runs adjacent the soldering blade along the entire length of the element, rather than merely butting up against the soldering tip with one end. Clearly this is a much more efficient heat transfer arrangement.

The channel 38 which seats the heating blade contacts not only the rear edge 48 of the blade, but the tangs 45 also laps substantially around the sides of the blade as shown in FIGS. 2-4 to provide maximum heat transferring surface. A groove 39 in one of the tangs makes it more yielding along the groove line to increase the compressibility of the tangs against the blade. Optimum heat transfer is important to the proper functioning of the unit because the soldering blade 40 is one of a set of soldering blades varying in width up to about over four inches. Thus in order for the same heating element that heats a small soldering point in a conventional soldering iron to heat a blade three inches long, the heat transfer must be much more efficient to transfer heat uniformly over a large surface area.

The blade 40 is made of copper for heat transfer purposes, but could be nickel plated along its tip, or over its entire surface except where it contacts the heating head to reduce oxidation.

There are two styles of blades, the chisel type 40 which comes in varying lengths, and a more specialized blade 50 shown in FIG. 4. This blade is characterized at its operating edge 52 as being parallel-sided and defining a U-shaped or V-shaped groove 54. The operation of this modified blade will be described subsequently with reference to FIG. 6.

IN OPERATION

Turning first to the use of the soldering iron for desoldering, the modified blade 50 is used as shown in FIG. 6. It is a specialized blade utilized for removing a connector as shown at 56, having closely spaced rows of leads 58. The tip 52 provides simultaneous solder melting heat to both of the rows, and in a matter of a second or so the connector can be easily pulled from the board 60. The purpose of the groove 50 is twofold, first being to deliver the heat efficiently to both rows of the solder joints 62 while keeping it away from the board, and secondarily it provides a reservoir to receive the melted solder and remove it from the board. The grooved blade comes in varying lengths as does the chisel blade, but is only used for the specialized task of removing narrow DIPs.

One of the principal removal techniques, and one maximally taking advantage of the broadhead soldering iron, is illustrated in FIG. 9. Here a typical DIP 64 has spaced rows 60 of leads 66 which pass through the board 60 to the solder joints 68. The chisel blade 40 is applied against one row at a time and in a matter of a second or so, the solder joints 68 of the entire row melt and permit that side of the DIP to be pried up from the board as much as possible with a pick 69. Generally the opposite side of the DIP restrains the DIP to the point that the first side will not come completely free, and so the second row is then freed, as shown in phantom, and then the first side is reheated so that the DIP is "walked" out, usually in three applications of the iron.

FIG. 10 illustrates an SMD 70 with leads 72 that are soldered to pads 74 of the typical printed circuit board 60. In the illustration, the right side has been removed by using the pick and iron and the left side is being removed in a very straightforward manner as shown. Smaller SMD's having only two leads can be removed with a chiseling action in a single stroke.

Turning now to the soldering capability of the iron, FIG. 5 illustrates a conventional (as opposed to surface mount) PC board 60 in which the leads 62 from the component pass through contact holes in the board. The first step in soldering the component is the selection of a solder blade 40 having a length corresponding to the row of leads to be soldered. Then, the soldering tip is positioned as shown in FIG. 5, and the soldering wire 76 is swept briefly across the tip of the soldering blade and the contacts. When this is done, and the blade is pulled along the component pins, the solder will usually settle evenly in all the holes in the board. If not, pulling the soldering blade back along the pins one more time will even the solder and eliminate any bridges. Using the blade, a long row of contacts can be soldered in about 15 seconds, compared to a minute or so using a point tip iron. A major advantage of the blade lies in its ability to deliver heat evenly to all the leads at once which produces a very uniform series of solder connections with no bridges.

When soldering surface mounted devices, the pads on the board and the component leads SMD should be tinned. As shown in FIGS. 11-14, tinning the pads is easily done by quickly heating the pads in a row as shown in FIG. 14, applying solder to the blade, and then spreading around the liquid solder. With the correct amount of solder, the pads will almost immediately be coated without leaving bridges. If any bridges or balls are formed, a stroke or two of the soldering blade will eliminate them. Tinning the components is generally done by applying a layer of solder to the soldering iron and then touching the row of contacts to the solder on the iron.

Once both sides of the solder connection have been tinned and flux applied, the SMD is quickly mounted as shown in FIG. 11 (fluxing has not been mentioned throughout this specification, but the normal fluxing requirements apply throughout). First, as shown at 78, the SMD is accurately positioned over the tinned pads on the board and the corner of the soldering iron is used to tack down the SMD at two opposite corners. Then the iron is applied to each row of contacts as shown at 80, wiped with the solder 76, and then the soldering iron is brushed around briefly until the solder is evenly applied and no beads exist. The heating and subsequent soldering of the SMD leads is shown in FIGS. 12 and 13, respectively.

One more use of the iron is shown in FIG. 15. Here, the through-hole contacts of a board 60 are being cleand up, with the solder being removed with a solder wick 84. Because the blade is so wide, this type of solder wicking operation can be done very quickly and efficiently.

The soldering blade illustrated and claimed herein is useful in soldering or desoldering virtually any of the components and high density component packages used today. Whether of the type in which the leads pass through the board, or of the surface mount variety, whether the contacts are straight, of the "gullwing" lead configuration or J-leaded components, whether extending from only one side of the package or all four, the broadhead blade configuration of the soldering iron described herein will create smooth and uniform solder joints, or remove same, a row at a time in minimal time.

I claim:

1. A method of processing an entire row of spaced leads of an electronic component utilizing a soldering iron having an elongated blade for a soldering tip, said blade being substantially the length of said row of leads, comprising the step of touching said entire row substantially simultaneously with said blade and holding said blade in contact with said row of leads at least until said row of leads substantially reaches the melting point of solder, said electronic component being a surface mounted device to be soldered to the pads of a printed circuit board, and said row of leads having been previously tinned and positioned on a row of said pads, and including the step of applying solder to said blade adjacent said leads, and stroking said blade along said leads in a direction substantially away from said component to cause said solder to settle around said leads and pads and evacuate from the spaces between the leads.

2. A method according to claim 1 and including the step of stroking said blade along said leads away from said component at least one additional time to clear solder between said leads.

* * * * *